(12) United States Patent
Yu

(10) Patent No.: US 6,407,691 B1
(45) Date of Patent: Jun. 18, 2002

(54) PROVIDING POWER, CLOCK, AND CONTROL SIGNALS AS A SINGLE COMBINED SIGNAL ACROSS AN ISOLATION BARRIER IN AN ADC

(75) Inventor: Quicheng Yu, Nashua, NH (US)

(73) Assignee: Cirrus Logic, Inc., Austin, TX (US)

( * ) Notice: Subject to any disclaimer, the term of this patent is extended or adjusted under 35 U.S.C. 154(b) by 1 day.

(21) Appl. No.: 09/690,981

(22) Filed: Oct. 18, 2000

(51) Int. Cl.$^7$ ................................................ H03M 1/00
(52) U.S. Cl. .................... 341/155; 341/108; 341/144
(58) Field of Search ................ 341/155, 108, 341/144

(56) References Cited

U.S. PATENT DOCUMENTS 4,380,757 A * 4/1983 Vancsa ................ 340/347 CC
6,169,801 B1 * 1/2001 Levasseur et al. .......... 379/413

* cited by examiner

Primary Examiner—Howard L. Williams
(74) Attorney, Agent, or Firm—Robert Platt Bell

(57) ABSTRACT

The present invention provides an isolated analog-to-digital converter system including an analog-to-digital subsystem including an analog-to-digital converter for converting an analog signal to a digital control stream. A microcontroller subsystem provides power, clock signals, and control signals as a single combined signal for the analog-to-digital converter, the single combined signal comprising a pulse train having a nominal frequency and having control pulse width modulated thereon. An isolation subsystem electrically isolates the analog-to-digital converter subsystem from the microcontroller subsystem. The isolation subsystem includes a first transformer, coupled to the microcontroller subsystem, which receives the single combined signal as a differential input signal. A full-wave rectifier, coupled to the first transformer, rectifies the differential input signal to produce at least one power supply voltage for the analog-to-digital converter subsystem. A voltage divider, coupled to one leg of the first transformer receives the differential input signal and outputs the combined pulse-width modulated control signals and clock signals to the analog-to-digital converter subsystem at a reduced amplitude.

16 Claims, 5 Drawing Sheets

PROVIDING POWER, CLOCK, AND CONTROL SIGNALS AS A SINGLE COMBINED SIGNAL ACROSS AN ISOLATION BARRIER IN AN ADC

CROSS-REFERENCE TO RELATED APPLICATIONS

The subject matter of the present application is related to that in co-pending U.S. patent application Ser. No. 09/901,899 entitled "SYSTEM AND METHOD FOR CALIBRATING ISOLATED ANALOG-TO-DIGITAL CONVERTERS" and co-pending U.S. patent application Ser. No. 09/834,630 entitled "CAPACITATIVELY COUPLED REFERENCES FOR ISOLATED ANALOG-TO-DIGITAL CONVERTER SYSTEMS", both of which are incorporated herein by reference.

FIELD OF THE INVENTION

The present invention relates to isolation for analog-to-digital converter systems, and more particularly to full duplex communications channels for isolated analog-to-digital converter systems.

BACKGROUND OF THE INVENTION

FIG. 1 is a block diagram of a measurement system 9 of the Prior Art. Such measurement systems may be used to measure various analog parameters in environments where voltage isolation is required. For example, in power monitoring systems (e.g., residential power metering) a measurement device (front end) may be measuring power at line voltage (e.g., 220 Volts) and some form of isolation may be required to protect the user and processor (back end) which may be at a much lower potential. Similarly, in medical systems, voltage isolation may be required as a fail-safe to prevent a patient from being electrocuted due to potential differences between various medical monitoring devices.

Referring to FIG. 1, measurement system 9 may include a digital signal processor (DSP) 11, link chip 12, capacitor C1 13, analog-to-digital converter (ADC) and link chip 15, and a sensor 16. Sensor 16 may comprise any one of a number of known analog sensors for measuring a particular parameter (e.g., temperature, pressure, voltage, amperage, power consumption, or the like).

Analog-to-digital converter (ADC) and link chip 15 may convert the analog output of sensor 16 to a digital value (typically a onebit data stream) and outputs this data stream to a digital signal processor (DSP) 11 via link chip 12 and isolation capacitor 13. In addition to digital data values transmitted from analog-to-digital converter (ADC) and link chip 15 to digital signal processor (DSP) 11, other signals may need to be exchanged between the two chips. For example, clock signals and control signals (including calibration signals or voltage levels) may be transmitted from digital signal processor (DSP) 11 to analog-to-digital converter (ADC) through link chip 15. In addition, digital signal processor (DSP) 11 may need to provide power supply voltage to analog-to-digital converter through link chip 15. In the Prior Art, additional signal lines may be required for such additional signals, increasing the complexity and cost of the device.

As noted above, in many applications, such as power metering, it may be necessary to isolate analog-to-digital converter (ADC) from link chip 15 and digital signal processor (DSP) 11 due to differences in voltage potential. To isolate the voltage potential between analog-to-digital converter and link chip 15 and digital signal processor (DSP) 11, an isolation capacitor 13 may be employed.

Such isolation practices, however, may create problems when attempting to communicate from digital signal processor (DSP) 11 and link chip 15 and analog-to-digital converter (ADC) and vice versa. With a small capacitance value C1 for capacitor 13, the use of a digital tri-state gate in link chip 12 and link chip portion of analog-to-digital converter (ADC) and link chip 15 for transmitting data is disadvantageous due to voltage division losses. Nevertheless, using a digital tri-state gate is advantageous for transmitter energy, clock, and command sources, as well as for receiver systems. However, when a transmitter produces a square wave according to a Manchester encoded clock and control scheme, for example, isolation capacitor 13 may block the square wave from the transmitting transformer.

FIG. 2 is a block diagram of another embodiment of a measurement system 19 of the Prior Art. Measurement system 19 includes a digital application specific integrated circuit (ASIC) or programmable logic device (PLD) 21 such as a digital signal processor and link chip, a resistor 22, capacitor 23, transformer 24, analog-to-digital converter (ADC) 25 and capacitor 26.

ASIC or PLD 21 may include a transmitter 27 and receiver 29 coupled to each other through switch 28. Data may be selectively transmitted and received over the connection between ASIC or PLD 21 and ADC 25. In addition, ASIC or PLD 21 may provide power to ADC 25 through this same link.

ADC 25 may include a diode 30 and a rectifier 31. Signals from secondary winding 33 of transformer 24 may be rectified by rectifier 31 and diode 30 to produce a voltage a capacitor 26 which in turn is the power supply for ADC 25.

As in the embodiment of FIG. 1, transmitter 27 may transmit to primary winding 32 of transformer 24 a square wave which may be partially blocked or distorted by capacitor 23 from transformer 24. ADC 25 may detect a pause during the tristate operation and takes over the data link, sending data and status back to receiver 29. During this take-over period, however, voltage at power supply 26 may droop significantly if many bits are transmitted, and full logic levels may not re-establish themselves.

SUMMARY OF THE INVENTION

The present invention provides an isolated analog-to-digital converter system including an analog-to-digital converter subsystem for converting an analog signal to a digital data stream. A microcontroller subsystem provides power, clock signals, and data signals as a single combined signal for the analog-to-digital converter, the single combined signal comprising a pulse train having a nominal frequency and having data pulse width modulated thereon. An isolation subsystem electrically isolates the analog-to-digital converter subsystem from the microcontroller subsystem.

The isolation subsystem includes a first transformer, coupled to the microcontroller subsystem, which receives the single combined signal as a differential input signal. A full-wave rectifier, coupled to the first transformer, rectifies the differential input signal to produce at least one power supply voltage for the analog-to-digital converter subsystem. A voltage divider, coupled to the first transformer receives the differential input signal and outputs the combined pulse width data signals and clock signals to the analog-to-digital converter subsystem at a reduced amplitude.

The full-wave rectifier includes a first diode having an anode coupled to one leg of the first transformer and a cathode capacitively coupled to another leg of the first transformer. The first diode produces a first supply voltage at its cathode. A second diode has a cathode coupled to the one leg of the first transformer and an anode capacitively coupled to the another leg of the first transformer. The second diode produces a second supply voltage at its anode.

In addition, a second transformer having one leg coupled to the analog-to-digital converter subsystem receives the digital data stream from the analog-to-digital converter synchronous with the clock signals and outputs the digital data stream to the microcontroller subsystem. The clock signal sent to the ADC allows the return data to be sent synchronously, greatly simplifying the return data path configuration.

DETAILED DESCRIPTION OF THE INVENTION

Figure 1:
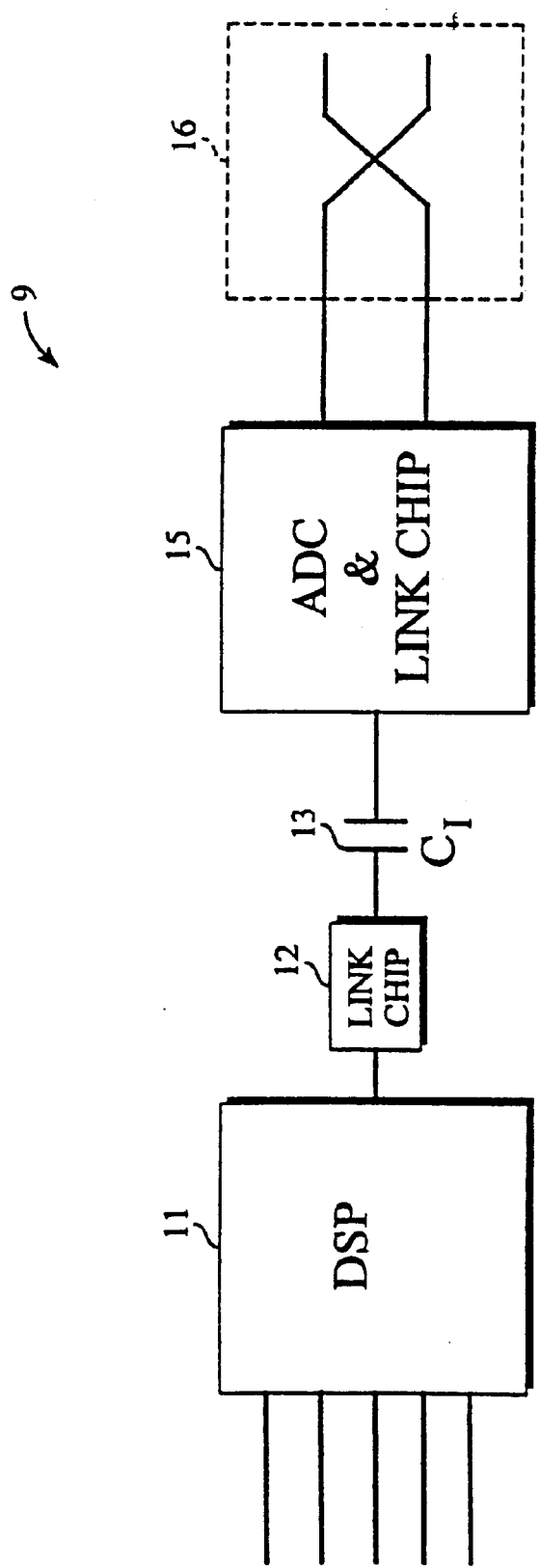
FIG. 1 is a block diagram of a measurement system of the Prior Art.
Figure 2:
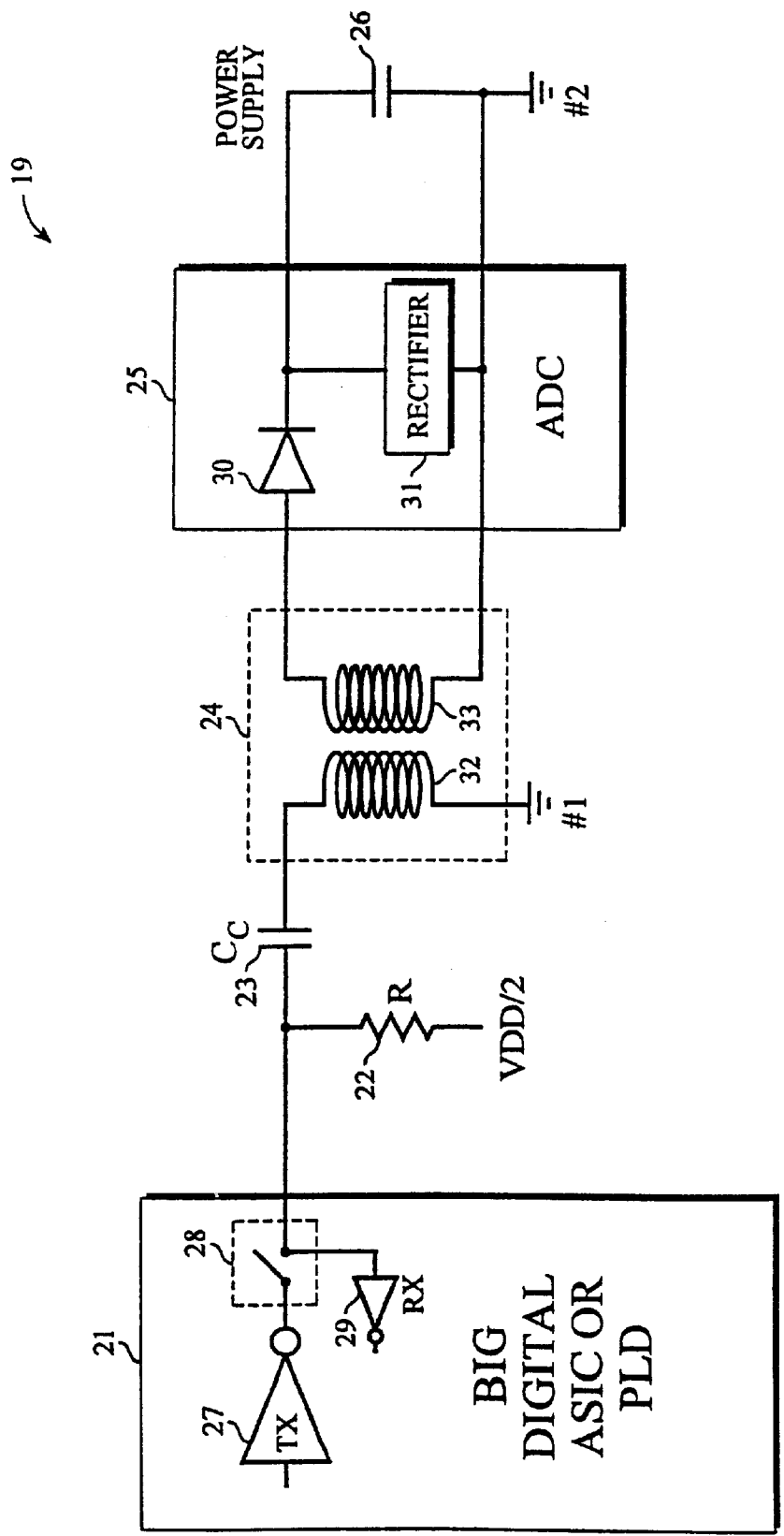
FIG. 2 is a block diagram of another embodiment of a measurement system 19 of the Prior Art.
Figure 3:
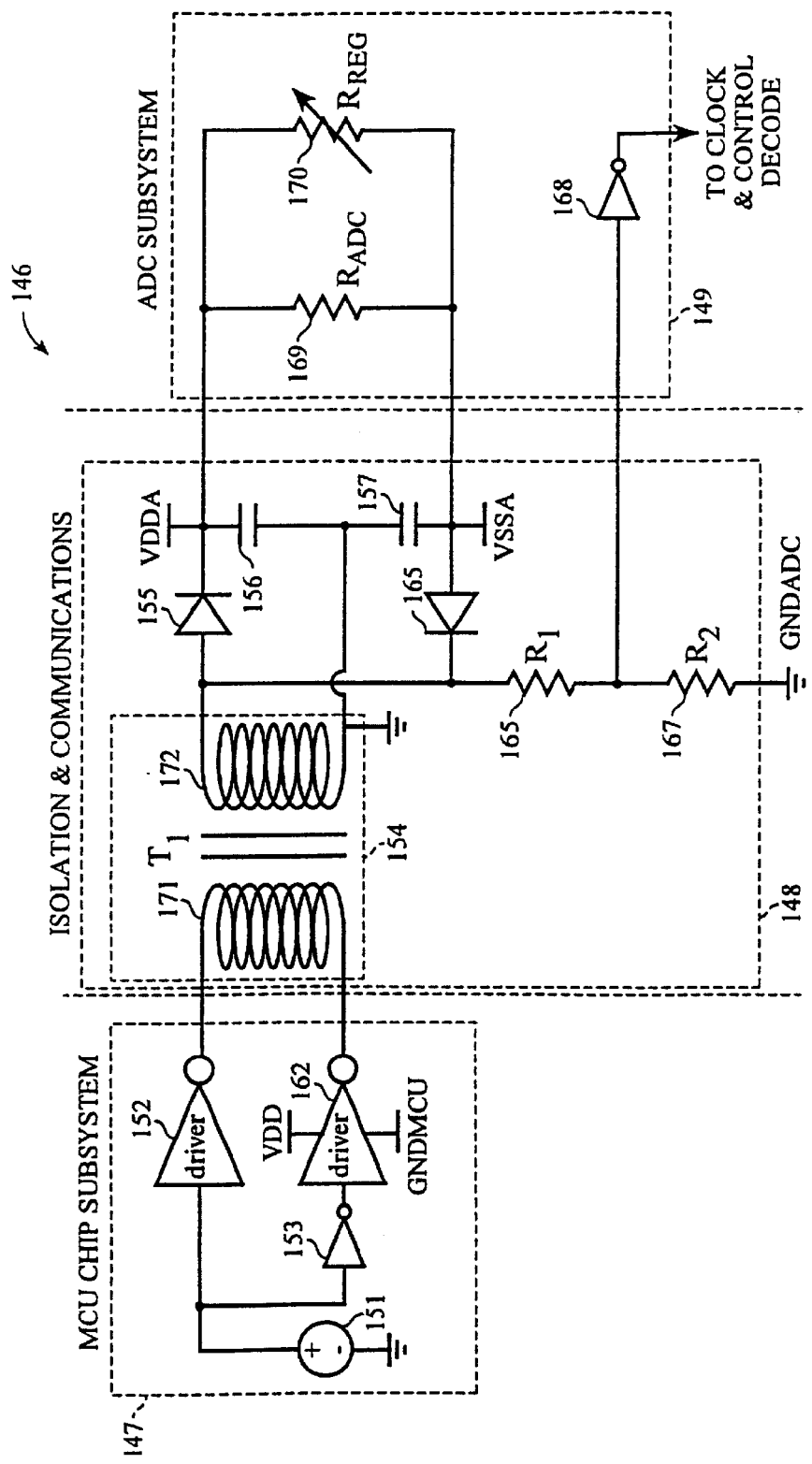
FIG. 3 is a block diagram of the forward path of an isolated analog-to-digital converter system of the present invention.

FIG. 3 is a block diagram of an isolated analog-to-digital converter system of the present invention. Converter system 146 includes a microcontroller (MCU) subsystem 147 (back end) for processing digitized data and for supplying control and clock signals as well as power to an ADC. ADC subsystem 149 (front end) measures an analog parameter, converts the analog parameter to a digital value and outputs the digital value to the microcontroller subsystem 147. ADC subsystem 149 receives control, and clock signals as well as power from MCU subsystem 147 and an isolation and communications subsystem 148.

Isolation and communications subsystem 148 couples MCU subsystem 147 to ADC subsystem 149, communicating control and clock signals as well as power from MCU subsystem 147 to ADC subsystem 149 and data back from ADC subsystem 149 to MCU subsystem 147, while providing voltage isolation between MCU subsystem 147 and ADC subsystem 149.

MCU subsystem 147 comprises a number of components. However, in the block diagram of FIG. 3, only those components of interest are illustrated. Clock signal generator 151 generates a pulse width modulated bit stream comprising a number of pulses at a nominal frequency having varying widths (e.g., narrow pulses and wide pulses) The resultant clock signal may thus be used to transmit both a nominal clock signal to ADC subsystem 149 as well as control data.

Figure 5:
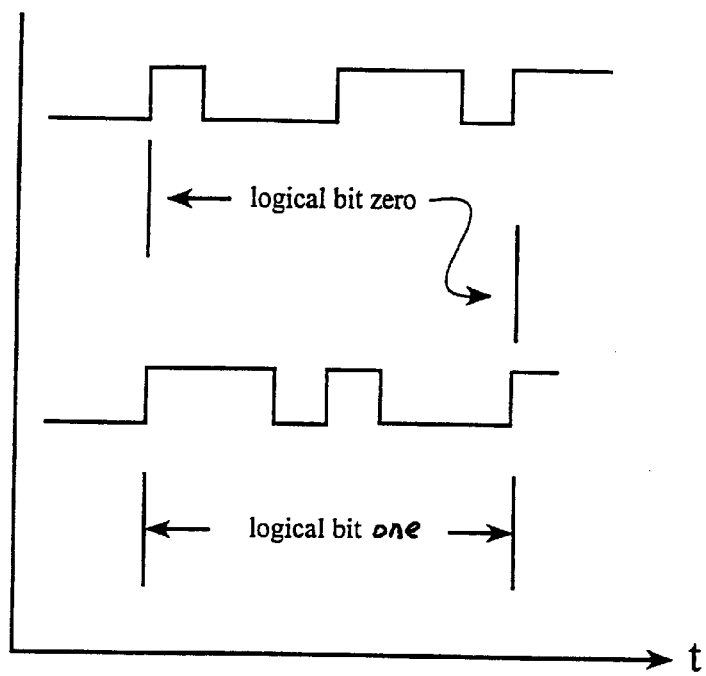
FIG. 5 illustrates pulse patterns of a logical bit zero (upper waveform) and a logical bit one (lower waveform).

FIG. 5 illustrates pulse patterns of a logical bit zero (upper waveform) and a logical bit one (lower waveform). Note that the overall duty cycle (high signal versus low signal) remains at 50% regardless of whether a logic bit zero or logic bit one is being transmitted.

The output of clock signal generator 151 is fed to inverter 153. The resulting non-inverted and inverted outputs of clock signal generator 151 are fed drivers 152 and 153, respectively, which form a differential type driver system. The respective outputs of drivers 152 and 162 are fed to corresponding legs of primary winding 171 of isolation transformer 151. Thus, as one leg of primary winding 171 is at a high voltage, the other is at a low voltage and vice-versa. Due to the 50% overall duty cycle of the pulse patterns, the net current through primary winding 171 is thus zero.

Transformer 154 outputs the resulting clock and control signal through secondary winding 172 as the same pulse width modulated bit stream, however electrically isolated from MCU subsystem 146. Diodes 155 and 165 along with capacitors 156 and 157 form a full wave rectifier. The resulting output provides operating voltage levels VDDA and VSSA to ADC subsystem 149.

ADC subsystem 149 comprises a number of components. However, in the block diagram of FIG. 3, only those components of interest are illustrated. Resistor $R_{ADC}$ represents the equivalent (load) resistance of the ADC subsystem. $R_{REG}$ represents the resistance of the shunt regulator which shunts current if supply voltage-to ADC subsystem 149 is too high. With variations in process, as well as environmental temperature, the internal resistance $R_{ADC}$ of ADC subsystem 149, may vary. $R_{REG}$ will vary to regulate VDDA and VSSA accordingly.

Resistors $R_1$ and $R_2$ form a voltage divider which reduces the overall amplitude of the clock/data signal from one leg of secondary winding 172. Reduction of the amplitude of the clock and control signal may be required to reduce the signal to a level below the supply voltage VDDA/VSSA. Electrostatic Discharge (ESD) protection diodes present in ADC subsystem 149 may turn on if the clock/data signal is at too high a voltage level. The output of the voltage divider is fed to ADC subsystem 149 through buffer 168 to clock and control decode circuitry (not shown).

Clock and control decode circuity generates an internal clock signal from the clock and control signal at the nominal frequency of the clock and control signal. In addition, clock and control decode circuitry retrieves the pulse width modulated control signal bit pattern from the data and control signal. Thus, the embodiment of FIG. 3 allows a single signal to provide power supply, clock, and control signals from MCU subsystem 147 to ADC subsystem 149.

Figure 4:
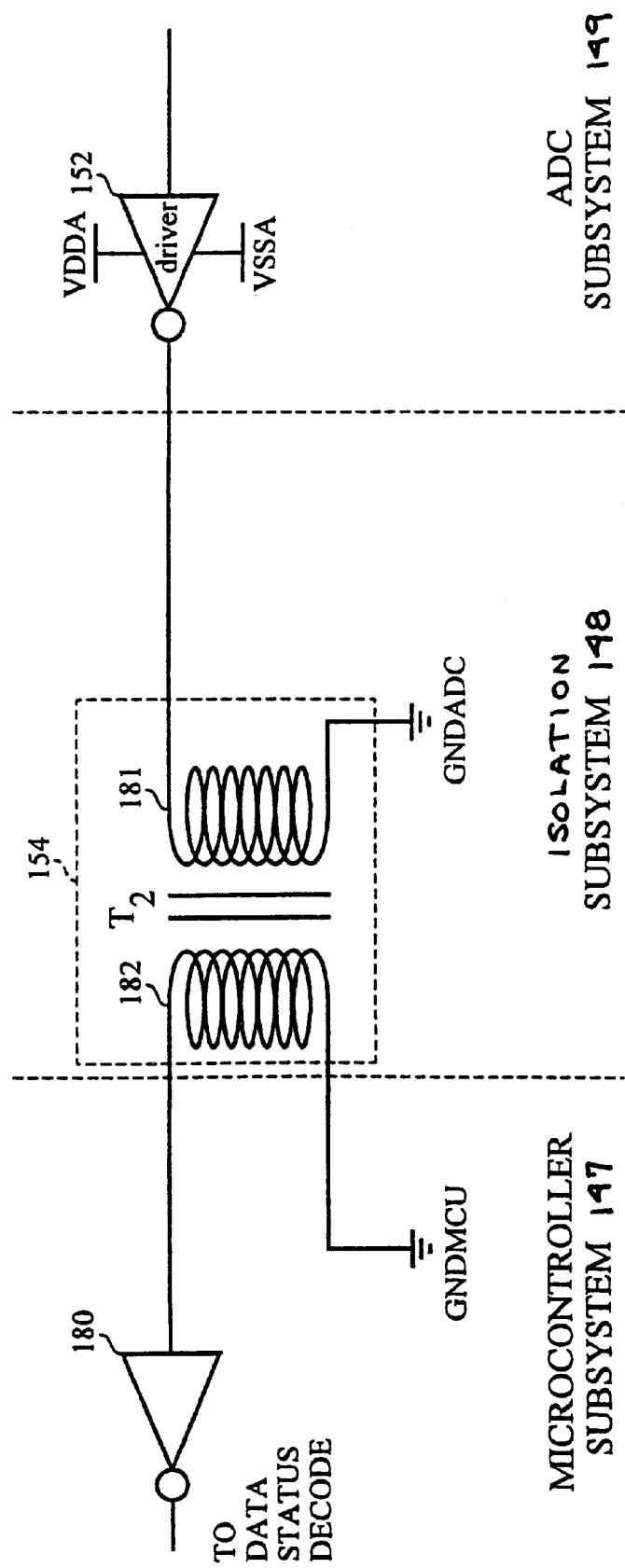
FIG. 4 is a block diagram illustrating the return path from an ADC subsystem to a MCU subsystem through an isolation subsystem.

FIG. 4 is a block diagram illustrating the return path from ADC subsystem 149 to MCU subsystem 147 through isolation subsystem 148. Again, only relevant components of each subsystem are illustrated in FIG. 4. Each subsystem contains other components not related to the discussion of FIG. 4.

Driver 152 of ADC subsystem 149 receives digital data from the analog-to-digital converter portion (not shown) of ADC subsystem 149. Unlike the embodiment of FIG. 3, a differential type driver may not be required for the return path. As both ADC subsystem 149 and MCU subsystem 147 are now operating with the same clock, a synchronous data stream of data may be transmitted from ADC subsystem 149 to MCU subsystem 147 through isolation transformer having primary and secondary windings 181 and 182. The use of pulse width modulation for the return path in the embodiment of FIG. 4 is not required.

Figure 6:
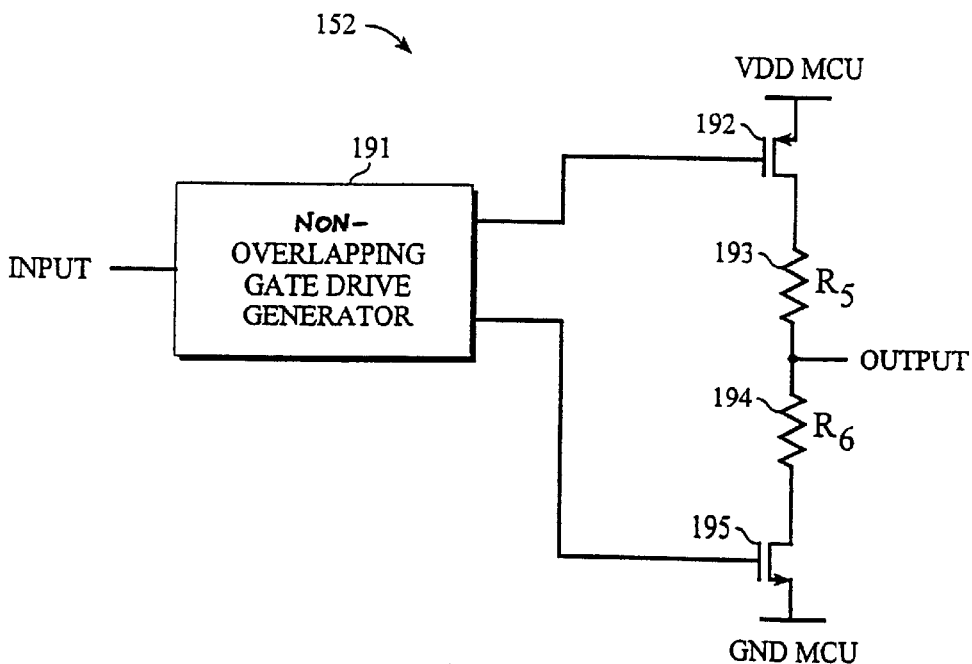
FIG. 6 is a block diagram illustrating elements of either of drivers 152 and 162 of FIG. 3.

FIG. 6 is a block diagram illustrating elements of either of drivers 152 or 162 of FIG. 3. As discussed above, the output of differential type drivers 152 and 162 is such that the net current is zero due to the duty cycle of the pulse patterns. When the output of driver 152 is high, the output of driver 162 is low, and vice versa. However, in order to avoid direct feed-through current from PMOSFET 192 to nMOSFET 195 during the event of an input transition. It is important that the two gate drive control signals 192 and 195 are such that 192 and 195 are never on at the same time.

In FIG. 6, non-overlapping gate drive generator 191 is provided to produce gate drive signals such that 192 and 195 are never on at the same time. Such overlapping gate drive generators are known in the art. The outputs of non-overlapping gate driver generator are such that when the input is at mid-rail both 192 and 195 are off.

The outputs of non-overlapping gate drive generator may be fed to transistors 192 and 195. Since non-overlapping gate drive generator generates a non-overlapping signal, transistors 192 and 195 will never both be on at the same time. Resistors R5 and R6 act to limit output current to the OUTPUT.

While the preferred embodiment and various alternative embodiments of the invention have been disclosed and described in detail herein, it may be apparent to those skilled in the art that various changes in form and detail may be made therein without departing from the spirit and scope thereof.

I claim:

1. An isolated analog-to-digital converter system comprising:
    an analog-to-digital converter subsystem including an analog-to-digital converter for converting an analog signal to a digital data stream;
    a microcontroller subsystem for providing power, clock signals, and control signals as a single combined signal for the analog-to-digital converter, the single combined signal comprising a pulse train having a nominal frequency and having control signal pulse width modulated thereon; and
    an isolation subsystem for electrically isolating the analog-to-digital converter subsystem from the microcontroller subsystem, the isolation subsystem comprising:
        a first transformer, coupled to the microcontroller subsystem, for receiving the single combined signal as a differential input signal, and
        a rectifier, coupled to the first transformer, for rectifying the differential input signal to produce at least one power supply voltage for the analog-to-digital converter subsystem.

2. The isolated analog-to-digital converter system of claim 1, wherein said isolation subsystem further comprises:
    a voltage divider, coupled to one leg of the first transformer for receiving the differential input signal and outputting the combined pulse width modulated control signals and clock signals to the analog-to-digital converter subsystem at a reduced amplitude.

3. The isolated analog-to-digital converter system of claim 1, wherein said rectifier further comprises:
    a first diode having an anode coupled to one leg of the first transformer and a cathode capacitively coupled to another leg of the first transformer, said first diode producing a first supply voltage at its cathode; and
    a second diode having a cathode coupled to the one leg of the first transformer and an anode capacitively coupled to the another leg of the first transformer, said second diode producing a second supply voltage at its anode.

4. The isolated analog-to-digital converter system of claim 1, wherein said isolation subsystem further comprises:
    a second transformer having one leg coupled to the analog-to-digital converter subsystem for receiving the digital data stream from the analog-to-digital converter synchronous with the clock signals and outputting the digital data stream to the microcontroller subsystem.

5. An isolated analog-to-digital converter system comprising:
    an analog-to-digital converter subsystem including an analog-to-digital converter for converting an analog signal to a digital data stream;
    a microcontroller subsystem for providing power, clock and control signals as a single combined signal for an analog-to-digital converter, the single combined signal comprising a pulse train having a nominal frequency and having control signal pulse width modulated thereon; and
    an isolation subsystem for electrically isolating the analog-to-digital converter subsystem from the microcontroller subsystem, the isolation subsystem comprising:
        a first transformer, coupled to the microcontroller subsystem, for receiving the single combined signal as a differential input signal, and
        a voltage divider, coupled to one leg of the first transformer for receiving the differential input signal and outputting the pulse width modulated clock and control signals to the analog-to-digital converter subsystem at a reduced amplitude.

6. The isolated analog-to-digital converter system of claim 5, wherein said isolation subsystem further comprises:
    a rectifier, coupled to the first transformer, for rectifying the differential input signal to produce at least one power supply voltage for the analog-to-digital converter subsystem.

7. The isolated analog-to-digital converter system of claim 6, wherein said rectifier further comprises:
    a first diode having an anode coupled to one leg of the first transformer and a cathode capacitively coupled to another leg of the first transformer, said first diode producing a first supply voltage at its cathode; and
    a second diode having a cathode coupled to the one leg of the first transformer and an anode capacitively coupled to the another leg of the first transformer, said second diode producing a second supply voltage at its anode.

8. The isolated analog-to-digital converter system of claim 5, wherein said isolation subsystem further comprises:
    a second transformer having one leg coupled to the analog-to-digital converter subsystem for receiving the digital data stream from the analog-to-digital converter synchronous with the clock signals and outputting the digital data stream to the microcontroller subsystem.

9. A method for isolating an analog-to-digital converter comprising the steps of:
    in an analog-to-digital converter subsystem including an analog-to-digital converter, converting an analog signal to a digital data stream,
    in a microcontroller subsystem, providing power, clock signals, and control signals as a single combined signal for the analog-to-digital converter, the single combined signal comprising a pulse train having a nominal frequency and having control signal pulse width modulated thereon, and
    in an isolation subsystem, electrically isolating the analog-to-digital converter subsystem from the microcontroller subsystem, said step of electrically isolating further comprising the steps of:
    in a first transformer, coupled to the microcontroller subsystem, receiving the single combined signal as a differential input signal, and
    in a rectifier, coupled to the first transformer, rectifying the differential input signal to produce at least one power supply voltage for the analog-to-digital converter subsystem.

10. The method of isolating an analog-to-digital converter system of claim 9, wherein said step of electrically isolating further comprises the steps of:
    in a voltage divider, coupled to one leg of the first transformer, receiving the differential input signal and outputting the combined pulse width modulated control signals and clock signals to the analog-to-digital converter subsystem at a reduced amplitude.

11. The method of isolating an analog-to-digital converter of claim 9, wherein said step of electrically isolating further comprises the steps of:
    producing a first supply voltage at the cathode of a first diode having an anode coupled to one leg of the first transformer and a cathode capacitively coupled to another leg of the first transformer, and
    producing a second supply voltage at the anode of a second diode having a cathode coupled to the one leg of the first transformer and an anode capacitively coupled to the another leg of the first transformer.

12. The method of isolating an analog-to-digital converter of claim 9, wherein said step of electrically isolating further comprises the steps of:
    in a second transformer having one leg coupled to the analog-to-digital converter subsystem, receiving the digital data stream from the analog-to-digital converter synchronous with the clock signals, and
    outputting, from the second transformer, the digital data stream to the microcontroller subsystem.

13. A method for isolating an analog-to-digital converter comprising the steps of:
    an analog-to-digital converter subsystem including an analog-to-digital converter for converting an analog signal to a digital data stream,
    a microcontroller subsystem for providing power, clock and control signals as a single combined signal for an analog-to-digital converter, the single combined signal comprising a pulse train having a nominal frequency and having control signal pulse width modulated thereon, and
    an isolation subsystem for electrically isolating the analog-to-digital converter subsystem from the microcontroller subsystem, said step of electrically isolating further comprising the steps of:
        in a first transformer, coupled to the microcontroller subsystem, receiving the single combined signal as a differential input signal, and
        in a voltage divider, coupled to one leg of the first transformer, receiving the differential input signal and outputting the pulse width modulated clock and control signals to the analog-to-digital converter subsystem at a reduced amplitude.

14. The method of isolating an analog-to-digital converter of claim 13, wherein said step of electrically isolating further comprises the steps of:
    a rectifier, coupled to the first transformer, for rectifying the differential input signal to produce at least one power supply voltage for the analog-to-digital converter subsystem.

15. The method of isolating an analog-to-digital converter of claim 14, wherein said step of electrically isolating further comprises the steps of:
    producing a first supply voltage at the cathode of a first diode having an anode coupled to one leg of the first transformer and a cathode capacitively coupled to another leg of the first transformer, and
    producing a second supply voltage at the anode of a second diode having a cathode coupled to the one leg of the first transformer and an anode capacitively coupled to the another leg of the first transformer.

16. The method of isolating an analog-to-digital converter of claim 14, wherein said step of electrically isolating further comprises the steps of:
    in a second transformer having one leg coupled to the analog-to-digital converter subsystem, receiving the digital data stream from the analog-to-digital converter synchronous with the clock signals, and
    outputting, from the second transformer, the digital data stream to the microcontroller subsystem.

* * * * *

UNITED STATES PATENT AND TRADEMARK OFFICE
Certificate

Patent No. 6,407,691                                                                       Patented: June 18, 2002

On petition requesting issuance of a certificate for correction of inventorship pursuant to 35 U.S.C. 256, it has been found that the above identified patent, through error and without any deceptive intent, improperly sets forth the inventorship. Accordingly, it is hereby certified that the correct inventorship of this patent is: Qicheng Yu, Nashua, New Hampshire; and Eric Swanson, Buda, Texas.

Signed and Sealed this Fourteenth day of January 2003.

MICHAEL J. TOKAR
*Supervisory Patent Examiner*
Art Unit 2819